United States Patent
Sakui et al.

(10) Patent No.: US 11,309,290 B2
(45) Date of Patent: Apr. 19, 2022

(54) SEMICONDUCTOR APPARATUS INCLUDING PENETRATION ELECTRODES CONNECTING LAMINATED SEMICONDUCTOR CHIPS

(71) Applicants: HONDA MOTOR CO., LTD., Tokyo (JP); TOKYO INSTITUTE OF TECHNOLOGY, Tokyo (JP)

(72) Inventors: Koji Sakui, Wako (JP); Takayuki Ohba, Tokyo (JP)

(73) Assignees: HONDA MOTOR CO., LTD., Tokyo (JP); TOKYO INSTITUTE OF TECHNOLOGY, Tokyo (JP)

(*) Notice: Subject to any disclaimer, the term of this patent is extended or adjusted under 35 U.S.C. 154(b) by 0 days.

(21) Appl. No.: 17/024,828

(22) Filed: Sep. 18, 2020

(65) Prior Publication Data

US 2021/0104497 A1  Apr. 8, 2021

(30) Foreign Application Priority Data

Oct. 4, 2019  (JP) .............................. JP2019-183712

(51) Int. Cl.
*H01L 25/065* (2006.01)

(52) U.S. Cl.
CPC ................... *H01L 25/0657* (2013.01); *H01L 2225/06544* (2013.01)

(58) Field of Classification Search
CPC ....... H01L 25/0657; H01L 2225/06544; H01L 24/06; H01L 2224/06135; H01L 2224/05009; H01L 2224/0557; H01L 24/08; H01L 2225/06513; H01L 2224/16146; H01L 2924/3512; H01L 25/50; H01L 2225/06541; H01L 2225/06565; H01L 2224/08146
See application file for complete search history.

(56) References Cited

U.S. PATENT DOCUMENTS

| | | | | |
|---|---|---|---|---|
| 2001/0054762 A1* | 12/2001 | Yamazaki | ............. | H01L 25/105 257/723 |
| 2007/0246816 A1* | 10/2007 | Tajika | ............... | H01L 21/76898 257/686 |
| 2011/0095289 A1* | 4/2011 | Sasaki | ................... | H01L 23/585 257/48 |
| 2011/0233648 A1* | 9/2011 | Seol | .................. | H01L 29/42348 257/324 |
| 2013/0105949 A1* | 5/2013 | Sasaki | .................... | H01L 25/50 257/620 |

(Continued)

FOREIGN PATENT DOCUMENTS

| | | |
|---|---|---|
| JP | 2006-277870 | 10/2006 |
| JP | 2018-032141 | 3/2018 |

*Primary Examiner* — Mamadou L Diallo
(74) *Attorney, Agent, or Firm* — Amin, Turocy & Watson, LLP

(57) ABSTRACT

A semiconductor apparatus according to an embodiment of the present invention includes: a plurality of semiconductor chips that are laminated; and a plurality of penetration electrodes that penetrate in a lamination direction through the plurality of semiconductor chips and that electrically connect together the plurality of semiconductor chips, wherein a semiconductor chip has at least one sub-memory array, and a penetration electrode penetrates through an outer circumferential part of the sub-memory array.

6 Claims, 7 Drawing Sheets

(56) References Cited

U.S. PATENT DOCUMENTS

| | | | |
|---|---|---|---|
| 2013/0207170 A1* | 8/2013 | Kurokawa | H01L 27/0207 |
| | | | 257/296 |
| 2013/0228898 A1* | 9/2013 | Ide | H01L 25/18 |
| | | | 257/621 |
| 2014/0097547 A1* | 4/2014 | Kuroda | H01L 25/0657 |
| | | | 257/777 |
| 2017/0025384 A1* | 1/2017 | Park | H01L 25/0657 |
| 2017/0033009 A1* | 2/2017 | Scanlan | H01L 24/13 |
| 2017/0317061 A1* | 11/2017 | Takahashi | H01L 27/146 |
| 2020/0097209 A1* | 3/2020 | Zhou | G06F 11/073 |

* cited by examiner

SEMICONDUCTOR APPARATUS INCLUDING PENETRATION ELECTRODES CONNECTING LAMINATED SEMICONDUCTOR CHIPS

CROSS-REFERENCE TO RELATED APPLICATION

Priority is claimed on Japanese Patent Application No. 2019-183712, filed on Oct. 4, 2019, the contents of which are incorporated herein by reference.

BACKGROUND

Field of the Invention

The present invention relates to a semiconductor apparatus.

Background

In recent years, an HBM (High Bandwidth Memory) in which DRAM chips are laminated to enlarge a bandwidth and increase a speed has attracted attention (for example, refer to Japanese Unexamined Patent Application, First Publication No. 2018-32141 and Japanese Unexamined Patent Application, First Publication No. 2006-277870). A currently developed cutting-edge HBM2 is formed of laminated four chips and includes an input/output I/O of 1024 channels. In order to adapt to the speed of a CPU/GPU having a further increased speed, HBMs to be developed in the future are required to increase an input/output I/O number by one digit or two digits in some way and to achieve a further large-scale parallel processing (Parallelism).

SUMMARY

In order to realize a large-scale parallel processing having an increased input/output I/O number by one digit to two digits, it is necessary to reduce the size of a TSV (Through Silicon Via) and narrow the pitch from a current 100 μm pitch to a several 10 μm pitch, and finally to a 10 μm pitch. However, since the film thickness of the laminated DRAM chips is about 50 μm and the laminated chip pitch is about 100 μm, reduction of the TSV size and narrowing of the pitch are prevented depending on a design rule, and the increase in the number of input/outputs (I/O) connected to the TSV is limited.

Further, the memory chip that has been developed so far has a configuration in which large-size TSVs are arranged collectively at a central portion of the chip. Therefore, a stress associated with the chips being joined together by a bump or the like is concentrated and applied on the central portion of each chip, and thereby, a problem such as cracking of the chip arises.

An aspect of the present invention is intended to provide a semiconductor apparatus capable of reducing a damage by a stress that occurs when semiconductor chips are joined together or the like.

A semiconductor apparatus according to a first aspect of the present invention includes: a plurality of semiconductor chips that are laminated; and a plurality of penetration electrodes that penetrate in a lamination direction through the plurality of semiconductor chips and that electrically connect together the plurality of semiconductor chips, wherein a semiconductor chip of the plurality of semiconductor chips has at least one sub-memory array, and a penetration electrode of the plurality of penetration electrodes penetrates through an outer circumferential part of the sub-memory array.

A second aspect of the present invention is the semiconductor apparatus according to the first aspect, wherein the plurality of semiconductor chips may be joined together via no bump.

A third aspect of the present invention is the semiconductor apparatus according to the first or second aspect, wherein a thickness of the semiconductor chip may be equal to or more than 2 μm and equal to or less than 10 μm.

A fourth aspect of the present invention is the semiconductor apparatus according to any one of the first to third aspects, wherein in the semiconductor chip, positions at which the penetration electrode penetrates may be distributed so as to constitute one or more rows along the outer circumferential part.

A fifth aspect of the present invention is the semiconductor apparatus according to any one of the first to fourth aspects, wherein the semiconductor chip may have a replacement sub-memory array.

In the semiconductor apparatus according to the aspect of the present invention, the penetration electrode penetrates through the outer circumferential part of each sub-memory array that constitutes the semiconductor chip, and the penetration portions are provided in a distributed manner within the semiconductor chip. Accordingly, since a stress generated in accordance with the joint of the penetration portion or the like is uniformly applied to the entire semiconductor chip, it is possible to reduce a damage such as crack generation by the stress being concentrated and applied on the central portion of the semiconductor chip.

DESCRIPTION OF THE EMBODIMENTS

Figure 1:
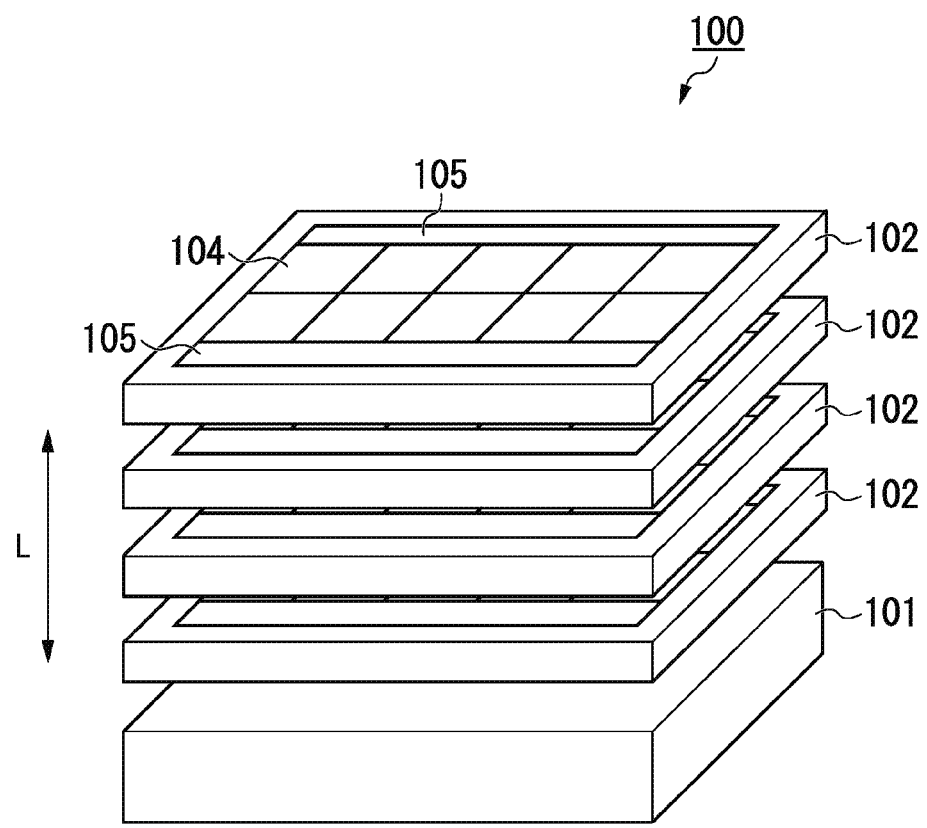
FIG. 1 is a perspective view of a semiconductor apparatus according to a first embodiment of the present invention.

Hereinafter, a semiconductor apparatus according to embodiments to which the present invention is applied will be described in detail with reference to the drawings. In order to make the features easy to understand, a characterizing portion may be enlarged in the drawings used in the following description for convenience, and the dimensional ratio or the like of each component is not necessarily the same as the actual dimensional ratio. The material, the size, and the like in the following description are merely examples, and the present invention is not limited thereto and can be appropriately changed without departing from the scope of the invention.

First Embodiment

Figure 2A:
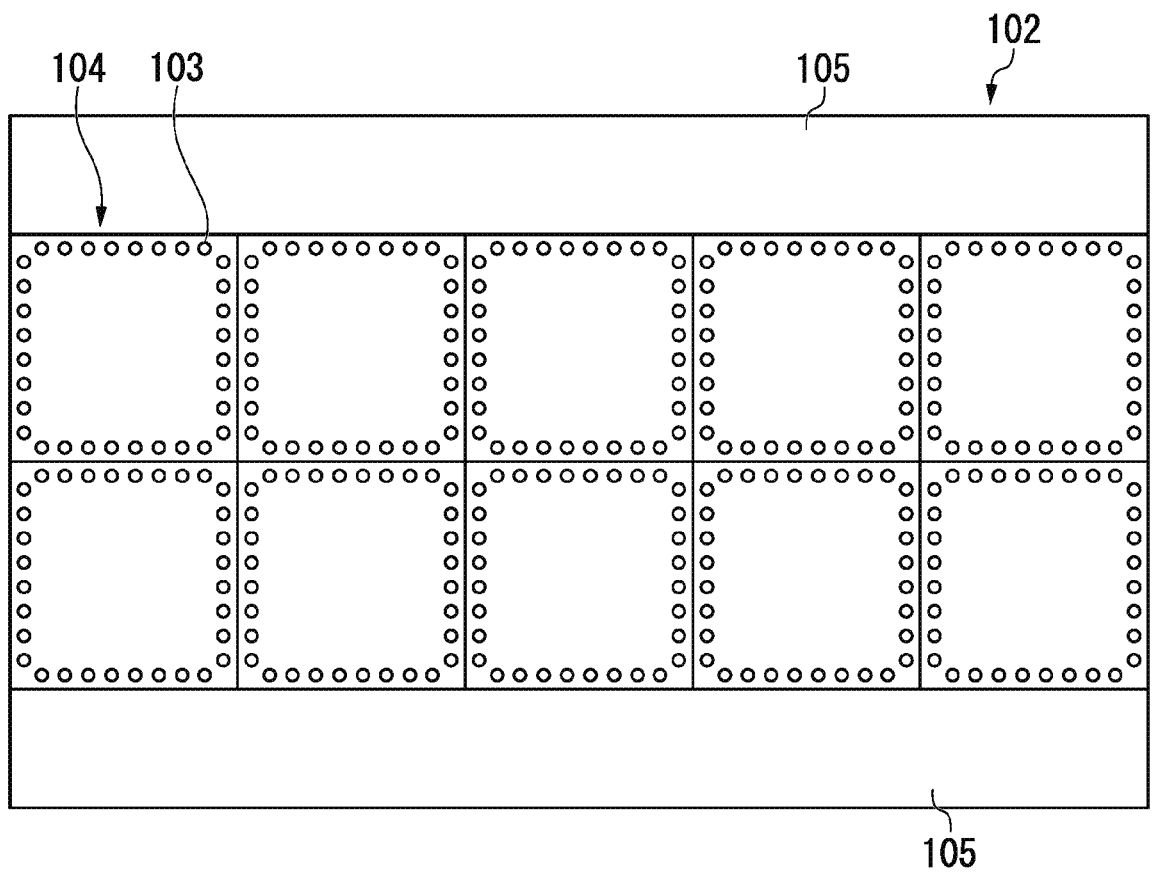
FIG. 2A is a plan view of a semiconductor chip that constitutes the semiconductor apparatus of FIG. 1.

FIG. 1 is a perspective view schematically showing a configuration example of a semiconductor apparatus 100 according to a first embodiment of the present invention. FIG. 2A is a plan view of a semiconductor chip 102 that constitutes the semiconductor apparatus 100. The semiconductor apparatus 100 mainly includes a base substrate 101, a plurality of semiconductor chips 102 laminated on the base substrate 101, and a penetration electrode (TSV) 103 that penetrates through the plurality of semiconductor chips 102 in a lamination direction L and that has one end fixed to the base substrate 101. The plurality of semiconductor chips 102 are electrically connected together via the penetration electrode 103.

The semiconductor chip 102 includes at least one or preferably a plurality of sub-memory arrays 104 such as a DRAM on a chip substrate formed mainly of a semiconductor material, an insulator material, and the like. Each sub-memory array 104 includes a predetermined functional element such as a DRAM. FIG. 1 shows an example having ten sub-memory arrays 104. The number of laminations of the semiconductor chip 102 is not limited.

In FIG. 1, the plurality of semiconductor chips 102 are shown to be spaced apart from each other but are actually joined together. However, when the plurality of semiconductor chips 102 are joined together so as to interpose a bump, a stress applied on the semiconductor chip increases due to the difference in a thermal expansion coefficient between a bump material and the semiconductor chip or the like.

Further, it is necessary to enlarge the length of the penetration electrode 103 since the distance between the semiconductor chips 102 is enlarged by the size of the bump. Further, from the relationship of an aspect ratio, it is necessary to thicken the penetration electrode 103 by an amount corresponding to the enlarged amount in length of the penetration electrode 103, and furthermore, it is necessary to enlarge the pitch between the penetration electrodes 103.

In consideration of the above, in order to achieve narrowing of the pitch and reduction of the size of the penetration electrode 103, the semiconductor chips 102 can be preferably joined together directly via no bump or so as to interpose an intermediate layer (adhesive layer or the like). When joining together the semiconductor chips 102 via no bump, the distance between the penetration electrodes 103 of adjacent sub-memory arrays 104 can be reduced without considering the contact between the bumps. Therefore, it is possible to provide the penetration electrode 103 at a position very close to an end portion 104c (hereinafter, may be simply referred to as an outer circumference) of an outer circumferential part 104a in each sub-memory array 104.

Narrowing of the pitch and reduction of the size of the penetration electrode 103 are further easily realized as the semiconductor chip 102 is made thinner. When assuming that the penetration electrode 103 is formed at a pitch of several tens μm, the thickness of the semiconductor chip 102 can be preferably equal to or less than 10 μm and can be further preferably equal to or less than 5 μm. However, if the semiconductor chip 102 is too thin, when a stress associated with the joint with another semiconductor chip 102 or the like is applied, the semiconductor chip 102 is easily cracked.

In view of prevention of the cracking, the thickness of the semiconductor chip 102 can be preferably equal to or more than 2 μm.

The penetration electrode 103 is a columnar structure that electrically connects together functional elements mounted on a different semiconductor chip 102. In terms of a process property, an electric property, and a cost, the penetration electrode 103 can be preferably formed of only a copper or a material containing about 80% or more of copper as a principal component. Other materials for the penetration electrode 103 can include, for example, tungsten (W) or the like.

An input/output (I/O) element (transistor) 105 that performs a signal input/output operation is connected to each of the plurality of penetration electrodes 103 such that a functional element (not shown) connected to each of the plurality of penetration electrodes 103 performs an ON or OFF operation at a predetermined timing. FIG. 1 shows a case in which the input/output element 105 is mounted on the semiconductor chip 102 at an uppermost layer, but the input/output element 105 may be mounted on another semiconductor chip 102.

One of the sub-memory arrays 104 on each semiconductor chip 102 overlaps in a lamination direction L with each of the sub-memory arrays 104 on another semiconductor chip in a one-to-one manner and is formed such that positions of the outer circumferential parts are substantially aligned to each other.

Figure 2B:
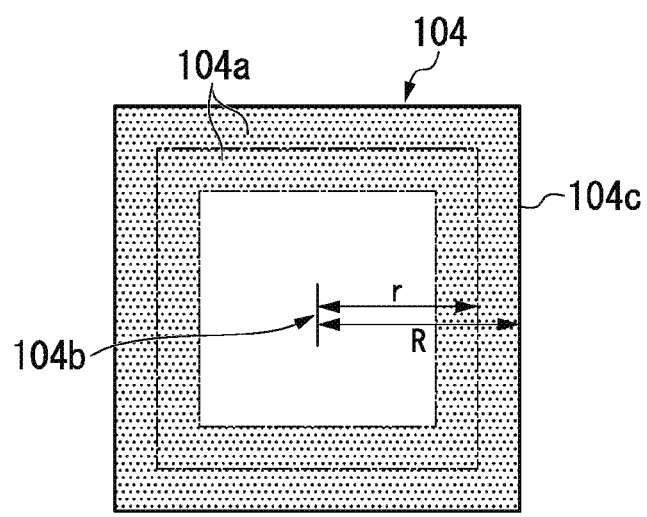
FIG. 2B is an enlarged view of one of a plurality of sub-memory arrays formed in the semiconductor chip of FIG. 2A.

FIG. 2B is an enlarged view of one of the plurality of sub-memory arrays 104 formed in the semiconductor chip 102 of FIG. 2A. Here, the penetration electrode 103 is not shown in the drawing. The penetration electrode 103 penetrates through the outer circumferential part 104a of the sub-memory array of each semiconductor chip 102. Further, the outer circumferential parts 104a of the sub-memory arrays of the semiconductor chips 102 that are overlapped with each other in the lamination direction L communicate with each other.

The outer circumferential part 104a may be a part excluding at least a portion close to a center 104b. When the distance to the outer circumferential end 104c from the center 104b of the sub-memory array is a distance R, the outer circumferential part 104a can be preferably a part where the distance r from the center 104b is approximately in a range of $0.5R \leq r \leq R$ and can be more preferably a part where the distance r from the center 104b is approximately in a range of $0.75R \leq r \leq R$.

As the number of sub-memory arrays 104 formed on the semiconductor chip 102 is increased, the outer circumference (end) 104c of the sub-memory arrays is arranged to form a fine mesh structure on the semiconductor chip 102. The penetration positions of the penetration electrodes 103 formed along (substantially parallel to) such an outer circumference 104c are uniformly distributed throughout the semiconductor chip 102. Accordingly, when the number of formed sub-memory arrays 104 is large, the stress generated in accordance with the joint by the penetration electrode 103 can be applied uniformly throughout the semiconductor chip.

From such a viewpoint, the number of sub-memory arrays 104 can be preferably four or more.

FIG. 1 shows an example in which penetrating positions of the penetration electrode 103 in the semiconductor chip 102 are distributed along the outer circumferential part 104a and more particularly along the outer circumference 104c so as to constitute a row. The penetrating positions of the penetration electrode 103 may be within the outer circumferential part 104a of the sub-memory array, and the positions may be distributed so as to constitute another shape or may be randomly distributed.

Figure 3:
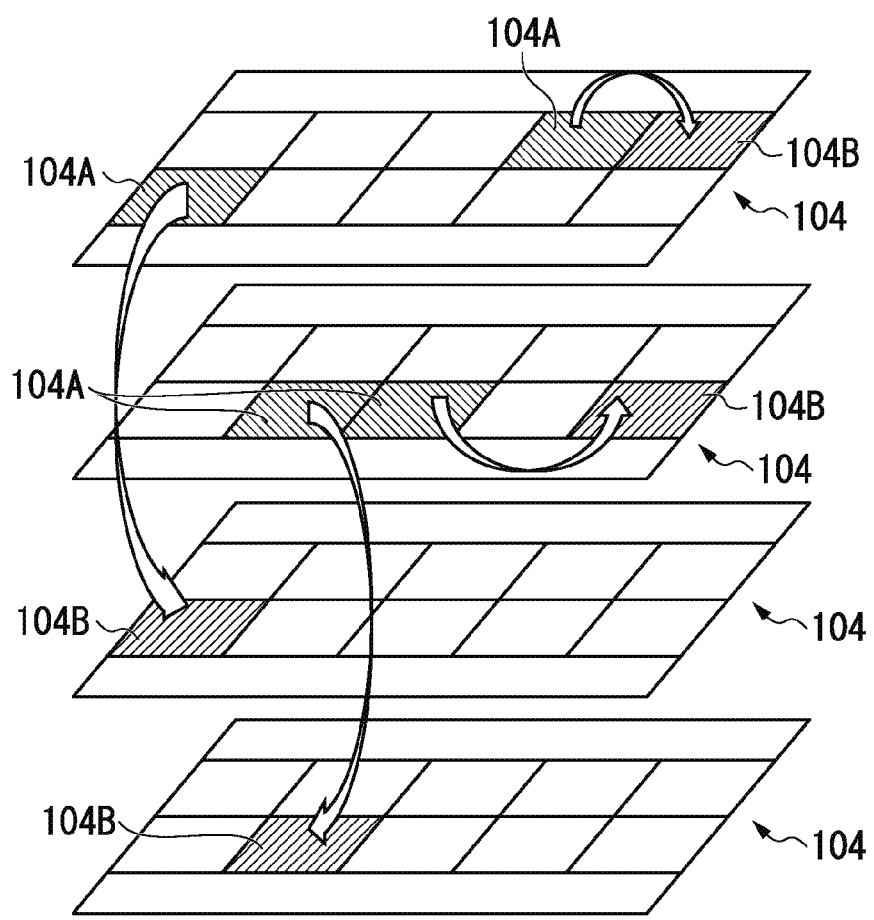
FIG. 3 is a perspective view showing only a sub-memory array extracted out of the semiconductor apparatus of FIG. 1.

FIG. 3 is a perspective view showing only the sub-memory array 104 extracted out of the semiconductor apparatus 100 of FIG. 1. By forming a large number of sub-memory arrays 104, some sub-memory arrays 104 can be allocated as a replacement bit 104B of a defective bit 104A, and redundancy as the semiconductor apparatus 100 can be enhanced. Replacement of the defective bit 104A may be configured to be performed within the same semiconductor chip 102 or may be configured to be performed between different semiconductor chips 102.

As described above, in the semiconductor apparatus 100 according to the present embodiment, the penetration electrode 103 penetrates through the outer circumferential part 104a of each sub-memory array 104 that constitutes the semiconductor chip 102, and the penetration portions are provided in a distributed manner within the semiconductor chip 102. Accordingly, since a stress generated in accordance with the joint of the penetration portion or the like is uniformly applied to the entire semiconductor chip 102, it is possible to reduce a damage such as crack generation by the stress being concentrated and applied on the central portion of the semiconductor chip 102.

Second Embodiment

Figure 4:
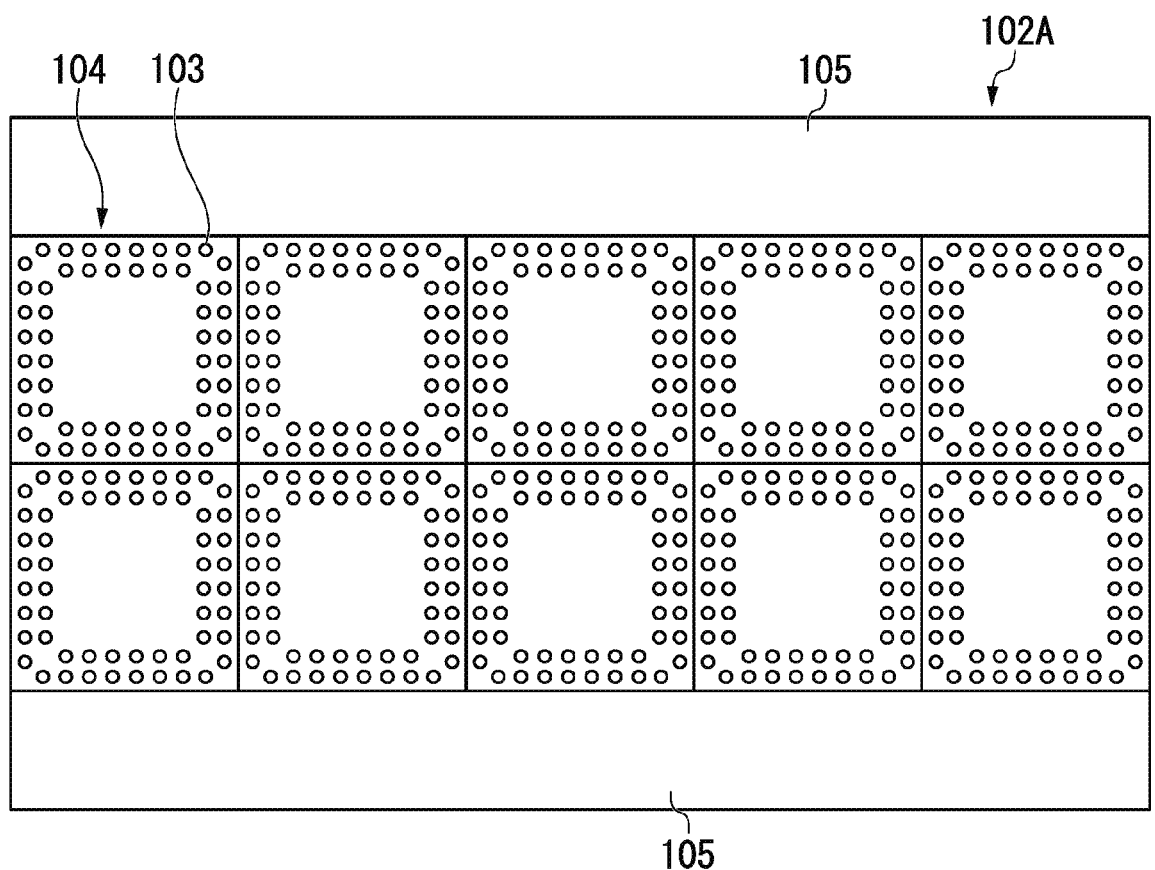
FIG. 4 is a plan view of a semiconductor chip according to a second embodiment of the present invention.

FIG. 4 is a plan view schematically showing a configuration example of a semiconductor chip 102A of a semiconductor apparatus according to a second embodiment of the present invention. In the semiconductor chip 102A of the present embodiment, in at least one sub-memory array 104, the penetrating positions of the penetration electrode 103 are distributed so as to constitute a plurality of rows aligned substantially parallel to the outer circumferential part 104a (outer circumference 104c). The other configuration is similar to the configuration of the semiconductor chip 102 and the semiconductor apparatus 100 of the first embodiment. The part that corresponds to the semiconductor apparatus 100 is indicated by the same reference numeral regardless of the difference of the shape.

FIG. 4 shows an example in which the number of rows is two; however, the number of rows may be three or more as long as the rows fall within the outer circumferential part 104a. Further, FIG. 4 shows an example in which two rows are aligned along the entire outer circumference 104c (entire circumference) of each sub-memory array 104; however, the number of rows is not necessarily uniformed along the entire outer circumference 104c. For example, the number of rows may be one at some part or may be three or more at some part.

According to the configuration of the present embodiment, since the number of penetration electrodes 103 increases compared to a case in which the number of rows is one, it is possible to simultaneously perform a further large number of input/output, and it is possible to improve the speed of parallel processing. Further, in the present embodiment, since the penetration electrode 103 is formed so as not to concentrate to and penetrate through the center portion of each sub-memory array 104, it is possible to reduce a damage such as crack generation similarly to the first embodiment.

Third Embodiment

Figure 5:
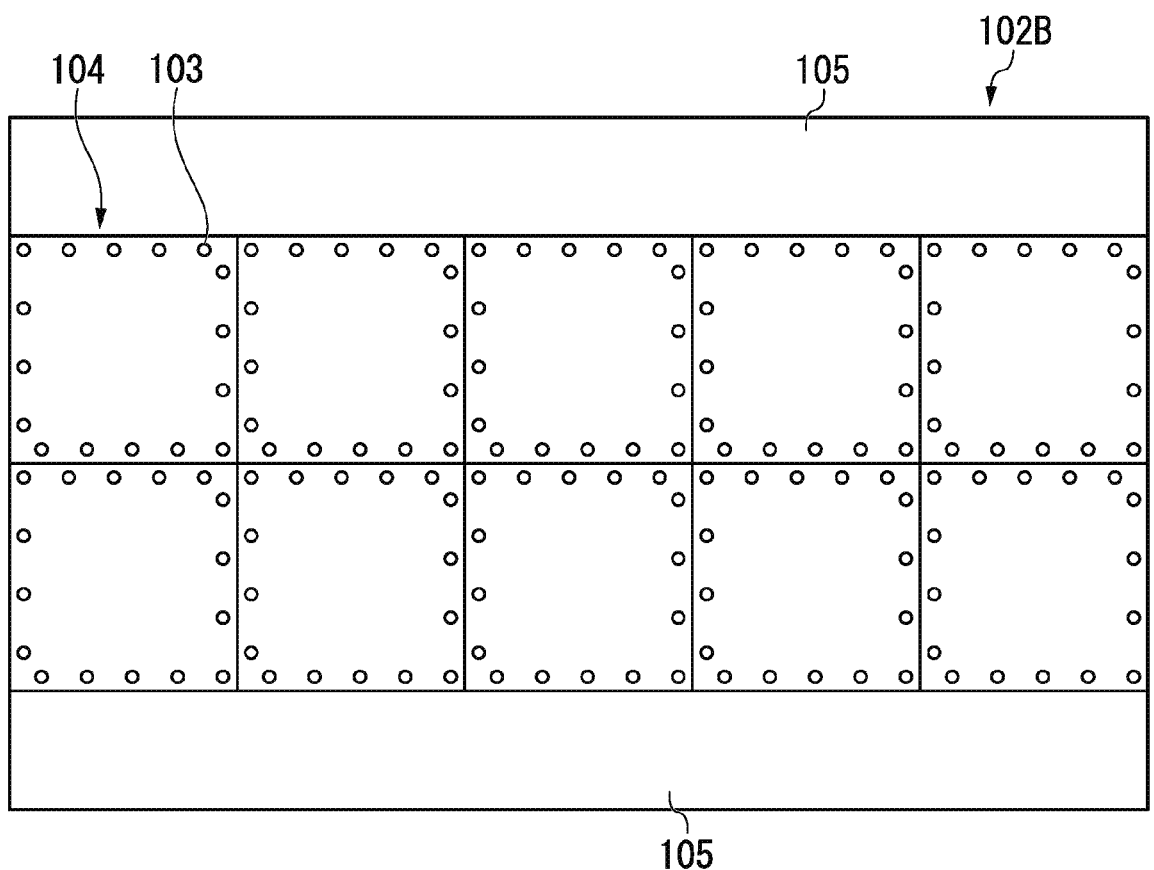
FIG. 5 is a plan view of a semiconductor chip according to a third embodiment of the present invention.

FIG. 5 is a plan view schematically showing a configuration example of a semiconductor chip 102B of a semiconductor apparatus according to a third embodiment of the present invention. In the semiconductor chip 102B of the present embodiment, a penetration electrode 103 adjacent to the outer circumference 104c and a penetration electrode 103 separated from the outer circumference 104c are alternately aligned along the outer circumference 104c. Further, the penetration electrodes 103 of adjacent sub-memory arrays 104 are aligned along a common outer circumference 104c such that the adjacency and separation are alternately repeated. The other configuration is similar to the configuration of the semiconductor chip 102 and the semiconductor apparatus 100 of the first embodiment. The part that corresponds to the semiconductor apparatus 100 is indicated by the same reference numeral regardless of the difference of the shape.

According to the configuration of the present embodiment, the penetration electrodes 103 of adjacent sub-memory arrays 104 have an asymmetric position relationship so as to interpose the common outer circumference 104c and are significantly separated from each other compared to the first and second embodiments having a symmetric position relationship. Therefore, it is possible to prevent a stress from being concentrated and applied to the vicinity of the outer circumference 104c, and furthermore, capacitive coupling between the penetration electrodes 103 at which the input/output is performed does not easily occur. In the present embodiment, since the penetration electrode 103 is formed so as not to concentrate to and penetrate through the center portion of each sub-memory array 104, it is possible to reduce a damage such as crack generation similarly to the first and second embodiments.

Fourth Embodiment

Figure 6:
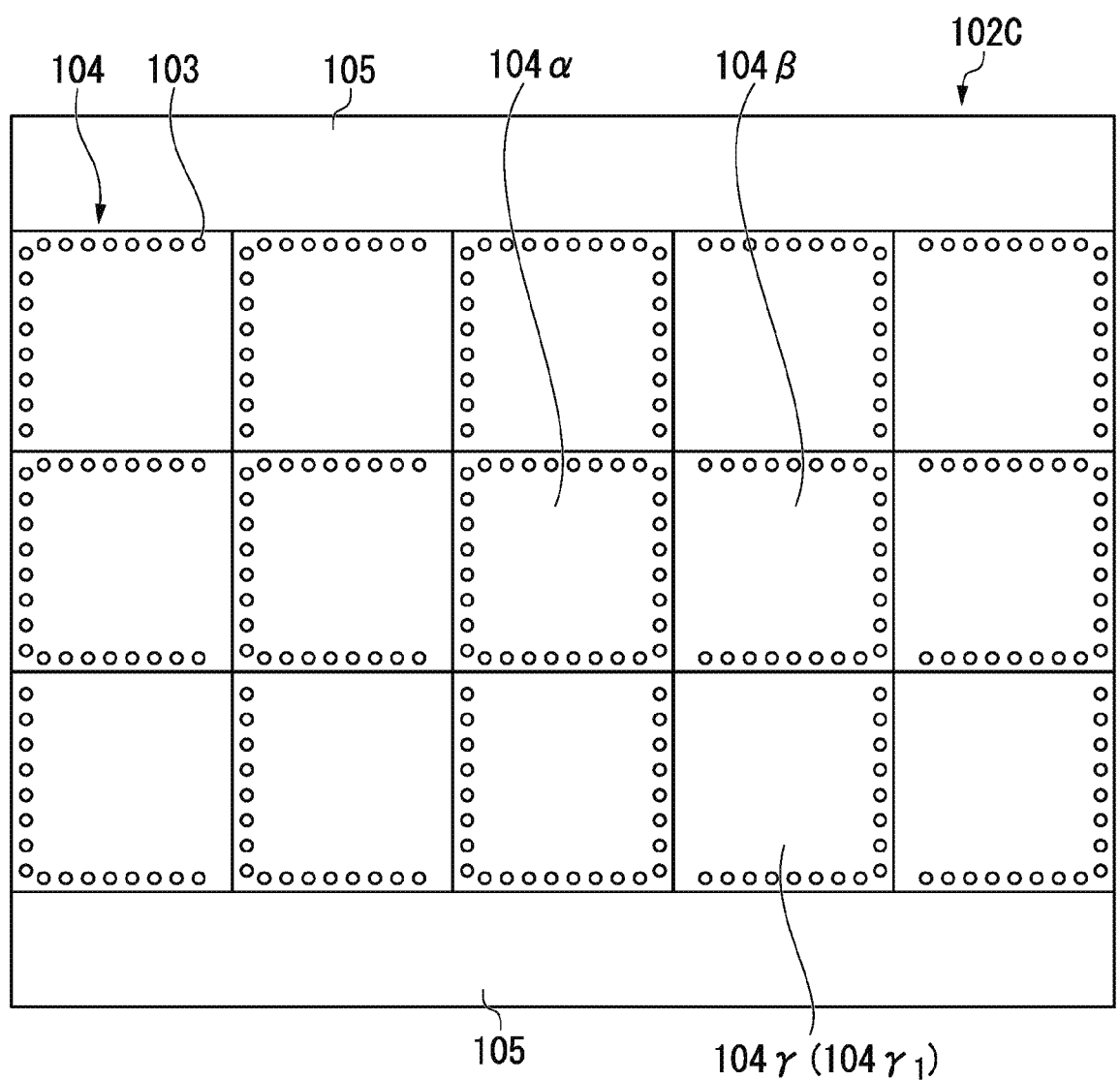
FIG. 6 is a plan view of a semiconductor chip according to a fourth embodiment of the present invention.
Figure 7:
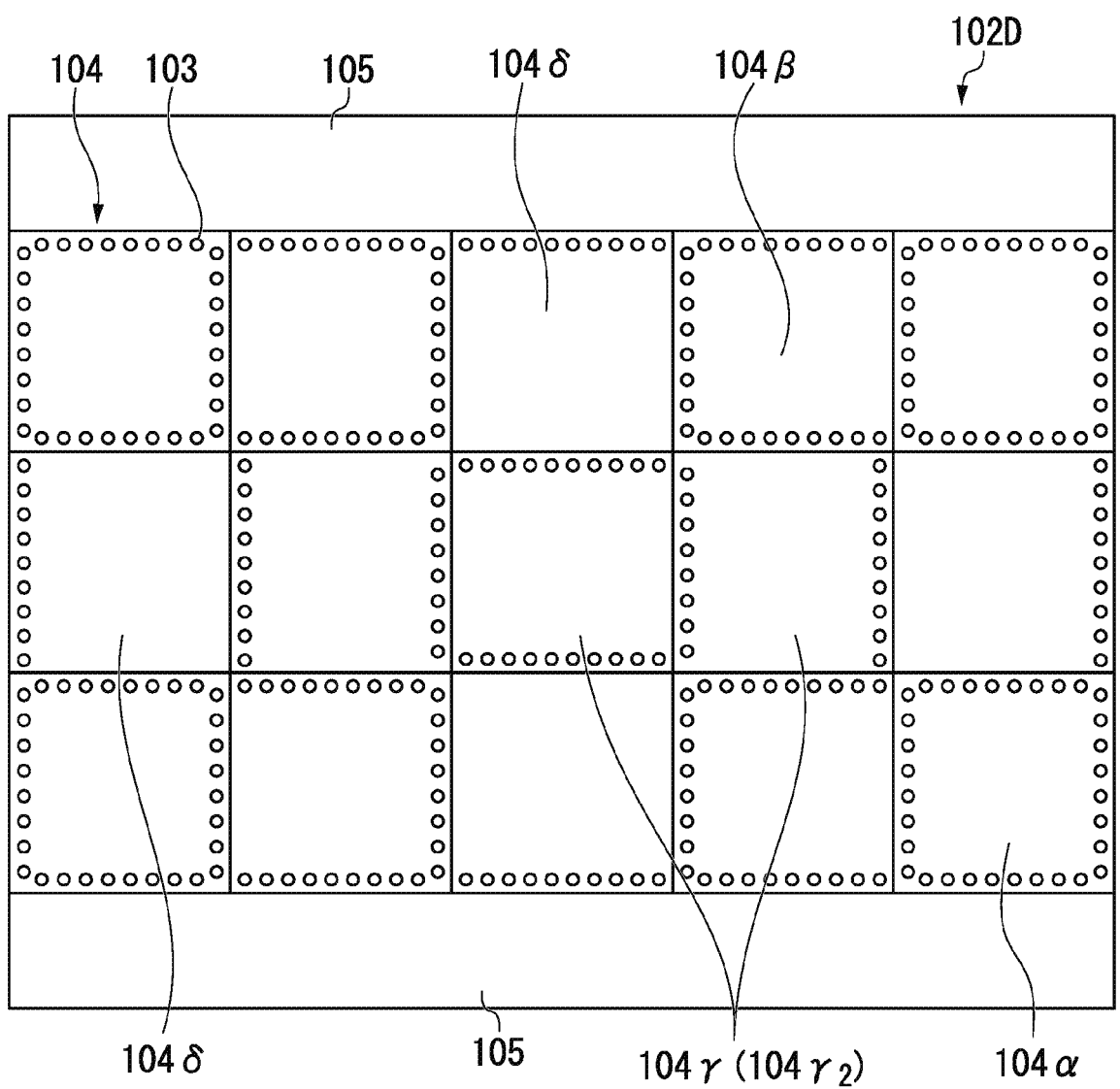
FIG. 7 is a plan view of a semiconductor chip according to the fourth embodiment of the present invention.

FIGS. 6 and 7 are plan views schematically showing a configuration example of a semiconductor chip 102C of a semiconductor apparatus according to a fourth embodiment of the present invention. In the semiconductor chips 102C, 102D of the present embodiment, the penetration electrode 103 is not aligned at an equal interval along the outer circumference of the sub-memory array 104. That is, the distance between adjacent penetration electrodes 103 within the same sub-memory array 104 varies depending on the position. The other configuration is similar to the configuration of the semiconductor chip 102 and the semiconductor apparatus 100 of the first embodiment. The part that corresponds to the semiconductor apparatus 100 is indicated by the same reference numeral regardless of the difference of the shape.

In the semiconductor chip 102 of the first, second, and third embodiments, penetration electrodes 103 are arranged along all of the four sides in any of the sub-memory arrays 104 having a rectangular shape. On the other hand, the semiconductor chip 102 of the present embodiment includes a sub-memory array 104a in which the penetration electrodes 103 are arranged along all of the four sides and sub-memory arrays 104β, 104γ, 104δ in which the penetration electrodes 103 are arranged along only three sides, two sides, or one side among the four sides. In the sub-memory array 104γ, it is possible to consider two cases of two sides in which the row of the penetration electrode 103 is aligned. In a first case, the two sides share one point. In a second case, the two sides face each other. The semiconductor chip 102C of FIG. 6 includes a sub-memory array $104γ_1$ of a case where the two sides share one point. The semiconductor chip 102D of FIG. 7 includes a sub-memory array $104γ_2$ of a case where the two sides face each other.

By combining the sub-memory arrays 104α, 104β, 104γ, 104δ and adjusting the alignment order and the orientation of the sub-memory arrays, it is possible to increase or decrease the number of rows of the penetration electrodes 103 arranged at the outer circumference 104c of the sub-memory array. For example, as shown in FIGS. 6 and 7, at a boundary between adjacent sub-memory arrays 104, by arranging the penetration electrode 103 only in one sub-memory array 104, it is possible to obtain a situation in which the penetration electrodes 103 are not aligned in two rows.

That is, the number of rows of the penetration electrodes in a part along the side to which another sub-memory array 104 is adjacent among the four sides of the sub-memory array 104 can be matched to the number of rows of the penetration electrodes in a part along a side to which another sub-memory array 104 is not adjacent among the four sides of the sub-memory array 104. Accordingly, throughout the semiconductor chip 102, the penetration electrode 103 is arranged at the same number of rows (here one row), and it is possible to enhance the uniformity of a stress applied to the semiconductor chip 102. In the present embodiment, by reducing stress concentration to the center portion of each sub-memory array 104 and uniformizing the stress applied to the outer circumferential part, it is possible to further strongly reduce a damage such as crack generation.

What is claimed is:

1. A semiconductor apparatus comprising:
a plurality of semiconductor chips that are laminated; and
a plurality of penetration electrodes that penetrate in a lamination direction through the plurality of semiconductor chips and that electrically connect together the plurality of semiconductor chips,
wherein a semiconductor chip of the plurality of semiconductor chips has at least one sub-memory array,
a penetration electrode of the plurality of penetration electrodes penetrates through an outer circumferential part of the sub-memory array, and
in the semiconductor chip, positions at which the penetration electrode penetrates are distributed so as to constitute a plurality of rows along the outer circumferential part.

2. The semiconductor apparatus according to claim 1, wherein the plurality of semiconductor chips are joined together via no bump.

3. The semiconductor apparatus according to claim 1, wherein a thickness of the semiconductor chip is greater than or equal to 2 μm and less than or equal to 10 μm.

4. A semiconductor apparatus, comprising:
a plurality of semiconductor chips that are laminated; and
a plurality of penetration electrodes that penetrate in a lamination direction through the plurality of semiconductor chips and that electrically connect together the plurality of semiconductor chips,
wherein a semiconductor chip of the plurality of semiconductor chips has at least one sub-memory array,
a penetration electrode of the plurality of penetration electrodes penetrates through an outer circumferential part of the sub-memory array, and
the semiconductor chip has a replacement sub-memory array.

5. The semiconductor apparatus according to claim 4, wherein the plurality of semiconductor chips are joined together via no bump.

6. The semiconductor apparatus according to claim 4, wherein a thickness of the semiconductor chip is greater than or equal to 2 μm and less than or equal to 10 μm.

* * * * *